United States Patent
Nagaraj et al.

(10) Patent No.: US 12,000,876 B2
(45) Date of Patent: Jun. 4, 2024

(54) CAPACITIVE SENSING

(71) Applicant: TEXAS INSTRUMENTS INCORPORATED, Dallas, TX (US)

(72) Inventors: Krishnasawamy Nagaraj, Plano, TX (US); Paul Kimelman, Alamo, CA (US); Abhijit Kumar Das, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 171 days.

(21) Appl. No.: 16/540,546

(22) Filed: Aug. 14, 2019

(65) Prior Publication Data

US 2019/0369148 A1 Dec. 5, 2019

Related U.S. Application Data

(63) Continuation of application No. 16/048,559, filed on Jul. 30, 2018, now Pat. No. 10,422,822, which is a continuation of application No. 14/189,461, filed on Feb. 25, 2014, now Pat. No. 10,060,959.

(60) Provisional application No. 61/770,116, filed on Feb. 27, 2013.

(51) Int. Cl.
*G01R 27/26* (2006.01)
(52) U.S. Cl.
CPC ................. *G01R 27/2605* (2013.01)
(58) Field of Classification Search
CPC ................................. G01R 27/2605
USPC ........................................ 324/613
See application file for complete search history.

(56) References Cited

U.S. PATENT DOCUMENTS

| | | | |
|---|---|---|---|
| 4,154,980 A | 5/1979 | Schmidt | |
| 6,275,047 B1 * | 8/2001 | Zoellick | G01R 27/2605 |
| | | | 324/548 |
| 6,594,613 B1 | 7/2003 | Ley | |
| 7,576,620 B2 | 8/2009 | Shen | |
| 7,986,193 B2 | 7/2011 | Krah | |
| 8,698,511 B2 | 4/2014 | Wendt | |
| 2007/0177417 A1 | 8/2007 | Coorulli et al. | |
| 2009/0009195 A1 | 1/2009 | Seguine | |
| 2010/0283752 A1 | 11/2010 | Maeda | |
| 2010/0321034 A1 * | 12/2010 | Hargreaves | H03K 17/955 |
| | | | 324/612 |

(Continued)

FOREIGN PATENT DOCUMENTS

WO  WO 2013177760 A1  12/2013

OTHER PUBLICATIONS

Cory et al. (6.071J Introduction to Electronics, Signals, and Measurement. Lesson Op Amp (cont.); Active Filters, Superdiode, Log, Antilog Filters; Spring 2006. Massachusetts Institute of Technology: MIT OpenCourseWare, https://ocw.mit.edu. License: Creative Commons BY-NC-SA.) (Year: 2006).*

*Primary Examiner* — Steven L Yeninas
*Assistant Examiner* — Rahul Maini
(74) *Attorney, Agent, or Firm* — Brian D. Graham; Frank D. Cimino

(57) ABSTRACT

A capacitive sensing system includes a controller, a node connected to one side of a capacitance, the controller configured to measure the capacitance by measuring a time for a voltage across the capacitance to reach a predetermined reference voltage, a noise measurement circuit configured to measure electrical noise on the node, and the controller receiving the measurement of noise from the noise measurement circuit.

21 Claims, 4 Drawing Sheets

(56) References Cited

U.S. PATENT DOCUMENTS

| | | | |
|---|---|---|---|
| 2011/0242048 A1 | 10/2011 | Guedon | |
| 2012/0161846 A1* | 6/2012 | Ningrat | G06F 3/044 327/365 |
| 2012/0200524 A1 | 8/2012 | Vallis | |
| 2012/0268415 A1 | 10/2012 | Konovalov | |
| 2012/0293447 A1* | 11/2012 | Heng | G06F 3/044 345/174 |
| 2013/0015866 A1 | 1/2013 | Wendt | |
| 2013/0093719 A1* | 4/2013 | Tokutake | G06F 3/044 345/174 |
| 2013/0106380 A1 | 5/2013 | Marsili et al. | |
| 2014/0057681 A1 | 2/2014 | Grivas | |
| 2014/0239983 A1 | 8/2014 | Nagaraj | |

\* cited by examiner

CAPACITIVE SENSING

This application is a continuation of U.S. patent application Ser. No. 16/048,559, filed on Jul. 30, 2018, which is a continuation of U.S. patent application Ser. No. 14/189,461, filed on Feb. 25, 2014, now U.S. Pat. No. 10,060,959, which claims priority to U.S. Provisional Application No. 61/770,116, filed on Feb. 27, 2013, each of which is hereby incorporated herein by reference in its entirety. This application is related to co-pending U.S. patent application Ser. No. 14/189,447 entitled "Capacitive Sensing", filed on Feb. 25, 2014, now U.S. Pat. No. 9,846,185, with the same inventorship and same assignee as this application.

BACKGROUND

Capacitive sensing measures a capacitance resulting from two or more conductive surfaces separated by a dielectric. Capacitive sensing is commonly used to detect a change in capacitance resulting from the proximity of a human hand, a touch of a human finger, or a touch of a conductive stylus. Capacitive sensing is commonly used for human interfacing with electronic systems, for example; mobile phones, tablet computers, electronic games, electronic instruments, appliances, automotive systems, and industrial systems.

There are many alternative methods for capacitive sensing. For example, a capacitance may be measured by using the capacitance in an oscillator and measuring the frequency of oscillation. Alternatively, a capacitance may be measured by measuring the attenuation of an AC signal. Alternatively, a capacitance can be measured by measuring the time required to charge the capacitance through a known resistance. Each alternative measurement method has inherent advantages, limitations and tradeoffs involving accuracy, cost, response-time, and so forth. In general, capacitive measurement circuits are affected by temperature, humidity, and electrical noise. There is an ongoing need for improved capacitive sensing.

DETAILED DESCRIPTION

Figure 1A:
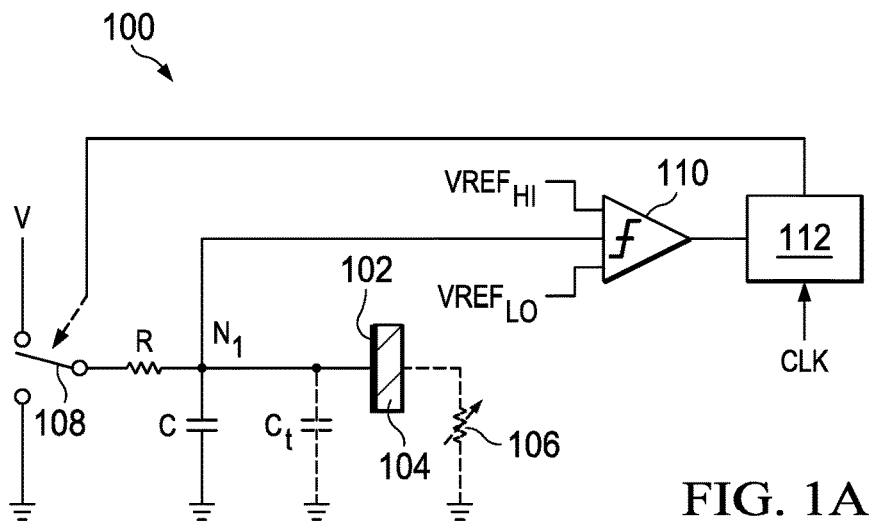
FIG. 1A is a block diagram schematic of an example capacitive sensing system.

FIG. 1A is a simplified block diagram of an example system 100 for illustrating some basic principles for one particular method for capacitive sensing. In the example of FIG. 1, a change in capacitance is measured by measuring the time required to charge or discharge the capacitance. In FIG. 1, a conductive capacitive plate 102 is separated from electrical ground by a dielectric 104. The dielectric 104 may be, for example, glass or air. An object 106 (for example, a human, depicted by an unknown variable resistance) provides a conductive path from the dielectric 104 to ground. There is an effective variable capacitance $C_t$ formed by the conductive plate 102, the dielectric 104, and the object 106. $N_1$ designates the node connecting the conductive plate 102 to the remaining circuitry. A switch 108 couples node $N_1$ to a voltage V or to ground. A capacitance C may be, for example, the total line capacitance resulting from all conductive traces connected to node $N_1$. Likewise, a resistance R may be the total resistance between the source of the voltage V and node $N_1$ (for example, the resistance of conductive traces and the resistance of switch 108).

The switch 108 is controlled by a timer/controller 112. When the switch 108 switches to the voltage V, the parallel capacitances (C and $C_t$) start charging. A comparator 110 compares the voltage at node $N_1$ to a high reference voltage $VREF_{HI}$ and to a low reference voltage $VREF_{LO}$. The timer/controller 112 measures the time from the moment that the switch 108 switches to the voltage V until the voltage at node $N_1$ equals the high reference voltage $VREF_{HI}$. When the comparator 110 switches states, the timer/controller causes the switch 108 to switch to ground and the combined capacitances (C and $C_t$) start discharging. If, for example, a person (106) is touching the dielectric 104 (or just in proximity to the conductive plate 102), then the effective capacitance $C_t$ is relatively large, and the parallel combination of capacitances (C and $C_t$) charges relatively slowly. If there is no object 106 present, then the effective capacitance $C_t$ is relatively small, and the parallel combination of capacitances (C and $C_t$) charges relatively rapidly.

Figure 1B:
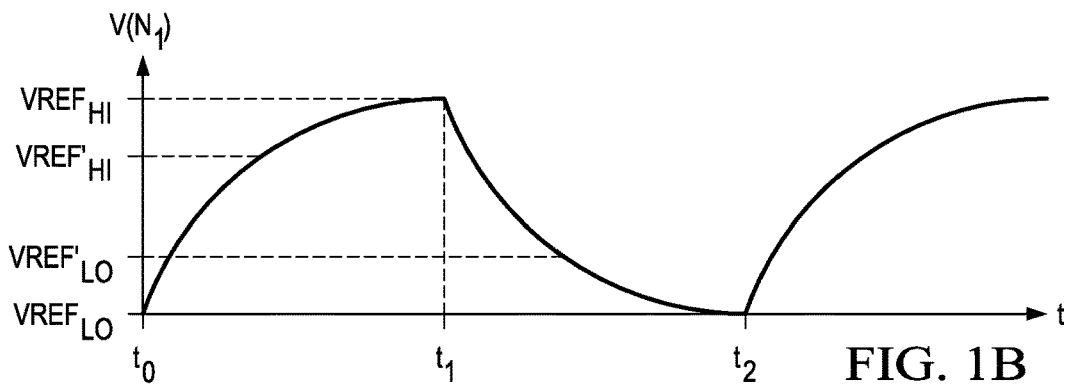
FIG. 1B is a timing diagram for a voltage waveform in the capacitive sensing system of FIG. 1A.

FIG. 1B illustrates an example waveform at node $N_1$. At time $t_0$ the timer/controller 112 causes switch 108 to switch to the voltage V and the capacitances (C and $C_t$) chart charging. At time $t_1$, the voltage at node $N_1$ reaches the high reference voltage $VREF_{HI}$ and the comparator 110 switches states. Also at time $t_1$, the timer/controller 112 causes switch 108 to switch to ground and the capacitances (C and $C_t$) start to discharge. At time $t_2$, the voltage at node $N_1$ reaches the low reference voltage $VREF_{LO}$ and the timer/controller 112 starts another timing period (causes switch 108 to switch to voltage V).

The system 100 is subject to numerous accuracy limitations. First, electrical noise on node $N_1$ can affect when the comparator 110 switches states. Node $N_1$ may be affected by both radiated and conducted electrical noise. The conductive plate 102 may receive electrical noise from unintended electric fields and node $N_1$ may receive noise coupled from other electrical traces. In addition, node $N_1$ may be affected by electrical noise on the power supply lines and on the ground lines. If capacitive measurements are made periodically, then a particular concern is periodic noise having the same period as the measurements. Second, if the timer 112 is a digital counter counting clock pulses (CLK) then there is some inherent inaccuracy (resolution) in the digital measurement of time. Third, the resistance R and the capacitances C and $C_t$ may vary with temperature and humidity.

As illustrated in the example of FIG. 1B, the rate of change of the voltage at node $N_1$ slows as the voltage at node $N_1$ increases towards the voltage V. If the high reference voltage $VREF_{HI}$ is close to the voltage V, then there is a relatively long time during which the voltage at node $N_1$ is close to the high reference voltage $VREF_{HI}$. Likewise, if the low reference voltage $VREF_{LO}$ is close to ground, then there is a relatively long time during which the voltage at node N1 is close to the low reference voltage $VREF_{LO}$. During the periods of time when the voltage at node N1 is close to one of the reference voltages ($VREF_{HI}$, $VREF_{LO}$), a small amount of noise can cause the comparator 110 to switch states at an inappropriate time (or to not switch states at the appropriate time). One way to improve noise immunity for the system of FIG. 100 is to set the reference voltages ($VREF_{HI}$, $VREF_{LO}$) at levels where the slope of the voltage at node $N_1$ is relatively high. For example, if $VREF_{LO}$ is set to 0.2*V and if $VREF_{HI}$ is set to 0.8*V, then the noise must be at least 0.2*V to cause the comparator 110 to switch states at an inappropriate time. These thresholds are depicted in FIG. 1B by $VREF_{LO'}$ and $VREF_{HI'}$.

For the example of FIG. 1A, the timer/controller 112 may measure the time for node $N_1$ to charge and/or discharge to the reference voltages ($VREF_{HI}$, $VREF_{LO}$). Alternatively, the timer/controller 112 may measure the number of charge/discharge cycles that occur during a fixed period of time.

Figure 2A:
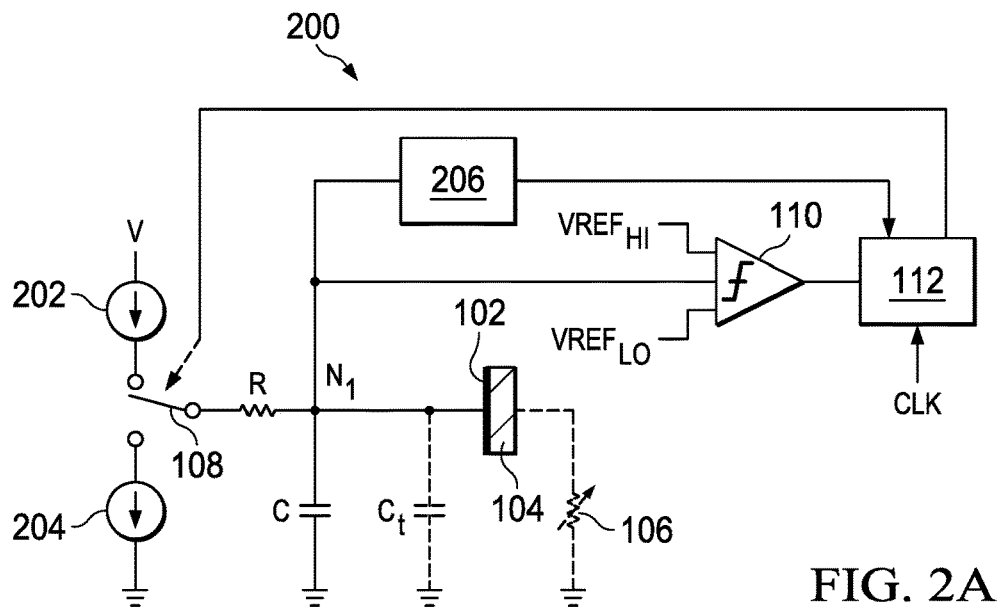
FIG. 2A is a block diagram schematic of an example alternative embodiment of the capacitive sensing system of FIG. 1A.
Figure 4A:
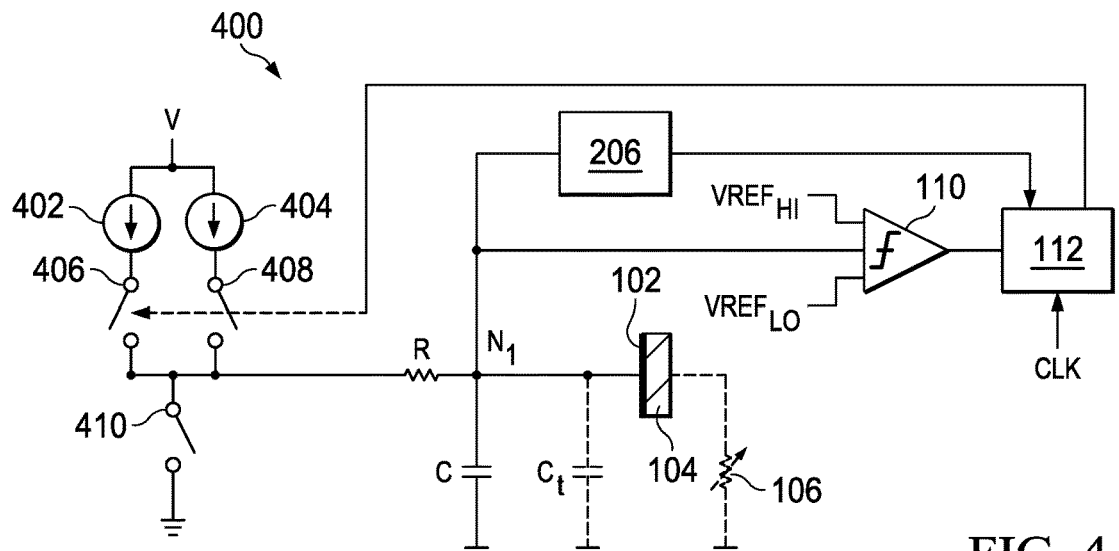
FIG. 4A is a block diagram of an alternative example embodiment of the capacitive sensing systems of FIGS. 1A and 2A.
Figure 4B:
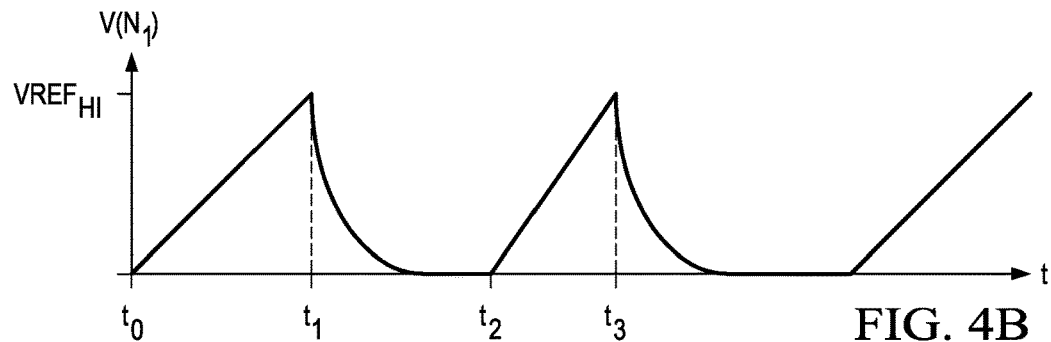
FIG. 4B is a timing diagram for an example voltage waveform in the capacitive sensing system of FIG. 4A.

FIGS. 2A and 4A illustrate example systems with several improvements to the system 100 in FIG. 1A. One improvement is that at least one constant current source is used to charge and/or discharge the capacitances (C and $C_t$). This causes the capacitances to charge and/or discharge linearly instead of charging and discharging with a decreasing slope. Linear charging and discharging reduces the time that the input to the comparator 110 is close to one of the reference voltage thresholds ($VREF_{HI}$, $VREF_{LO}$), and therefore reduces the time window in which the comparator 110 is sensitive to noise. In addition, a current source may overdrive some noise on node $N_1$. A second improvement is that the measurements may be controlled to be a-periodic even when the capacitance (parallel C and $C_t$) is constant. This reduces the effects of periodic noise. One method for making the measurements a-periodic is illustrated in FIG. 2D and a second method for making the measurements a-periodic is illustrated in FIGS. 4A and 4B. A third improvement is that noise on node $N_1$ may be measured to enable the system to compensate for noise, and/or to avoid measurements when the noise is too high, and/or to reject measurements that may have been subjected to unusual bursts of noise. A fourth improvement is to reject measurements that lie outside expected limits.

In FIG. 2A, elements having the same reference numbers as in FIG. 1A are all as described in conjunction with FIG. 1A. In the example system 200 of FIG. 2A, there are two current sources 202 and 204. At any given time, at most one of the current sources 202 and 204 is coupled to node $N_1$. As discussed in conjunction with FIGS. 2C and 2D, one current source 202 or 204 may be optional.

Figure 2B:
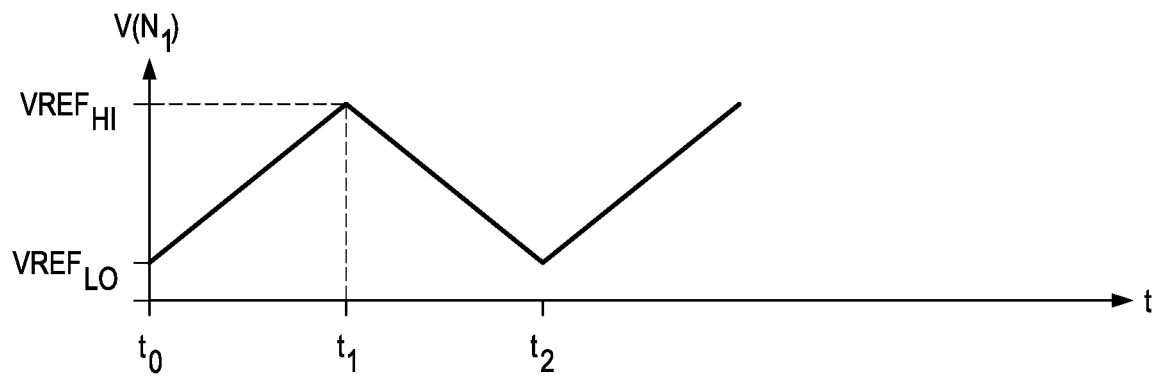
FIG. 2B is a timing diagram for an example voltage waveform in the capacitive sensing system of FIG. 2A.

FIG. 2B illustrates an example waveform for node $N_1$ in FIG. 2A. At time $t_0$, the timer/controller 112 causes switch 108 to switch to current source 202 and the capacitances (C and $C_t$) start linearly charging. At time $t_1$, the voltage at node $N_1$ reaches the high reference voltage $VREF_{HI}$ and the comparator 110 switches states. Also at time $t_1$, the timer/controller 112 causes switch 108 to switch to current source 204 and the capacitances (C and $C_t$) start to linearly discharge. At time $t_2$, the voltage at node $N_1$ reaches the low reference voltage $VREF_{LO}$ and the timer/controller 112 starts another timing period (causes switch 108 to switch to current source 202). Note that linear charging and discharging reduces the time that the input to the comparator 110 is close to one of the reference voltage thresholds ($VREF_{HI}$, $VREF_{LO}$), and therefore reduces the time window in which the comparator 110 is sensitive to noise.

Figure 2C:
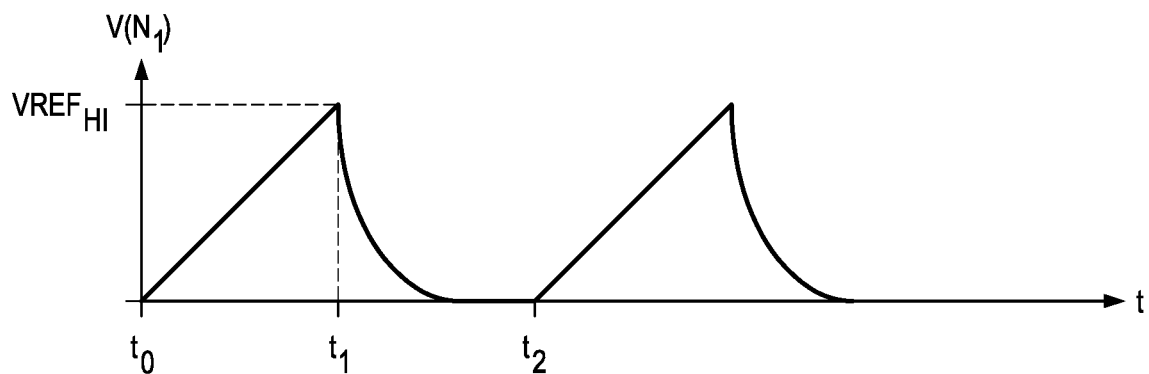
FIG. 2C is a timing diagram for an alternative example voltage waveform in the capacitive sensing system of FIG. 2A.
Figure 2D:
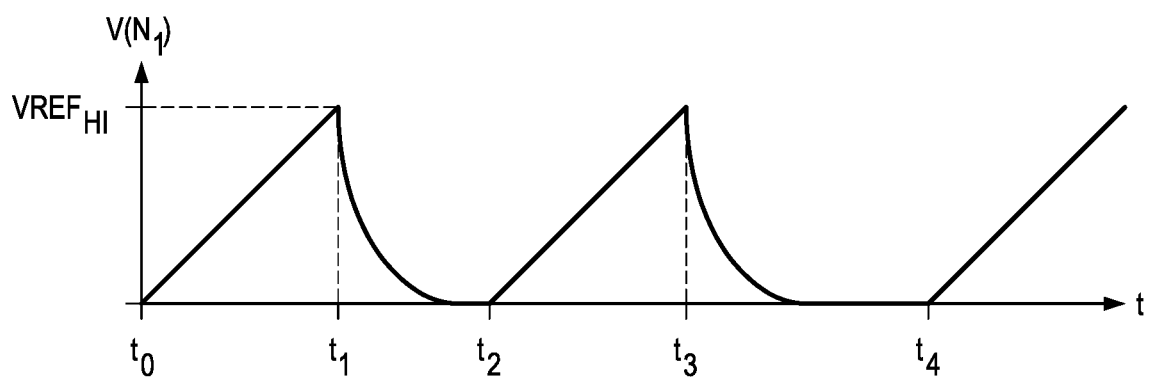
FIG. 2D is a timing diagram for an alternative example voltage waveform in the capacitive sensing system of FIG. 2A.

FIG. 2C illustrates an example waveform for node $N_1$ for an alternative embodiment of the system 200 of FIG. 2A. For FIG. 2C, assume there is no current source 204 and instead, switch 108 couples node $N_1$ to current source 202 or to ground. For FIG. 2C, also assume that the timer/controller 112 determines the time at which each new timing period begins independent of when the voltage at node N1 falls to the low reference voltage $VREF_{LO}$. At time $t_0$, the timer/controller 112 causes switch 108 to switch to current source 202 and the capacitances (C and $C_t$) start linearly charging. At time $t_1$, the voltage at node $N_1$ reaches the high reference voltage $VREF_{HI}$ and the comparator 110 switches states. Also at time $t_1$, the timer/controller 112 causes switch 108 to switch to ground and the capacitances (C and $C_t$) start to discharge. At time $t_2$ the timer/controller 112 starts another timing period (causes switch 108 to switch to current source 202).

The voltage on node $N_1$ in FIG. 2A as depicted in FIG. 2C may be susceptible to noise having the same timing. In the example of FIG. 2C, the measurement time period from $t_1$ to $t_2$ is determined by the timer/controller 112. This measurement time period from $t_1$ to $t_2$ may be randomized by the timer/controller 112 to cause the time period for capacitance measurements to vary even when the capacitance (parallel C and $C_t$) is constant. For example, the timer controller 112 may generate a pseudo-random time period for the time from $t_1$ to $t_2$. Alternatively, the timer controller 112 may pseudo-randomly choose from two or more predetermined time periods. An example a-periodic waveform is illustrated in FIG. 2D. In FIG. 2D, the time period from $t_1$ to $t_2$ is not equal to the time period from $t_3$ to $t_4$. Note that in the examples of FIGS. 2C and 2D, charging is linear but discharging is non-linear (current source 202 but not current source 204). Alternatively, the system 200 may be configured so that discharging is linear and charging is non-linear (current source 204 but not current source 202) and the timer/controller 112 may vary the charging times. Alternatively, both charging and discharging may be linear or non-linear, and the timer/controller 112 may vary either the charging time period or the discharging time period.

Figure 3A:
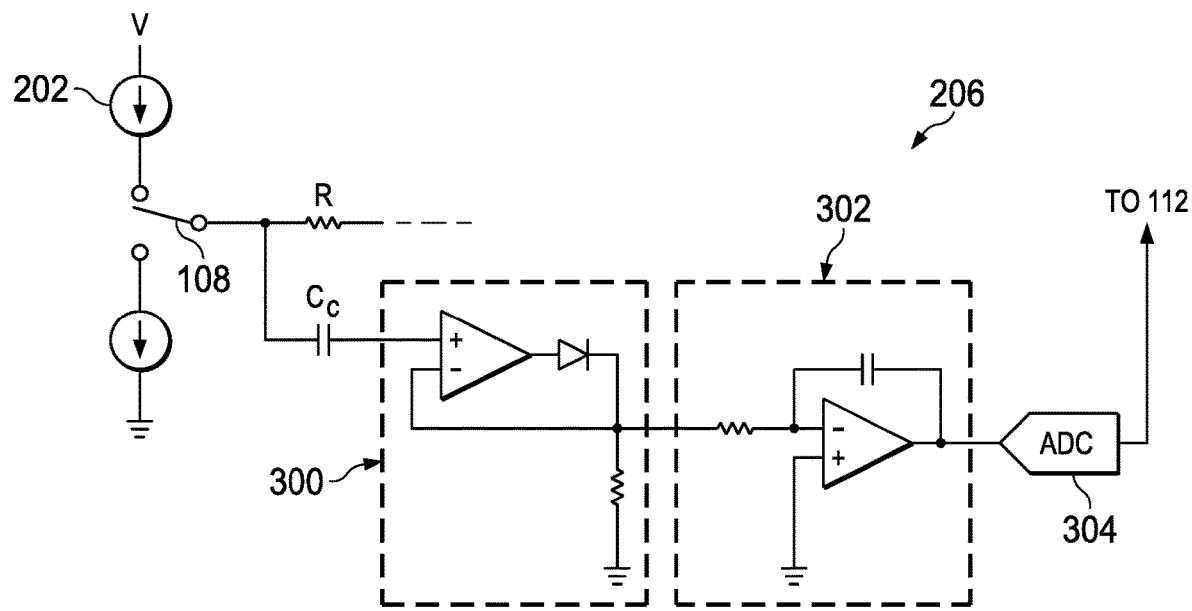
FIG. 3A is a block diagram schematic of an example embodiment of a noise detection circuit in the system of FIG. 2A.

The system 200 in FIG. 2A includes a noise measurement circuit 206. FIG. 3A illustrates additional detail for an example embodiment of the noise measurement circuit 206 in FIG. 2A. Only part of FIG. 2A is duplicated in FIG. 3A to facilitate illustration and discussion. In the example of FIG. 3A, the switch 108 is coupled to a rectifier circuit 300, followed by an integrator 302, followed by an analog-to-digital converter (N/D) 304. The output of the A/D 304 is read by the timer/controller 112. The measurement circuit 206 may optionally be capacitively coupled (capacitor $C_c$). Assuming that resistance R (trace resistance) is small, the circuit of FIG. 3A effectively measures noise on node $N_1$ and integrates the noise over time. The N/D 304 then provides a digital measure of that noise to the timer/controller 112. If the circuit of FIG. 3A is capacitively coupled (capacitor $C_c$), then the circuit of FIG. 3A measures AC noise, and may be used whether the switch 108 is switched or not-switched to one of the current sources (202, 204).

Figure 3B:
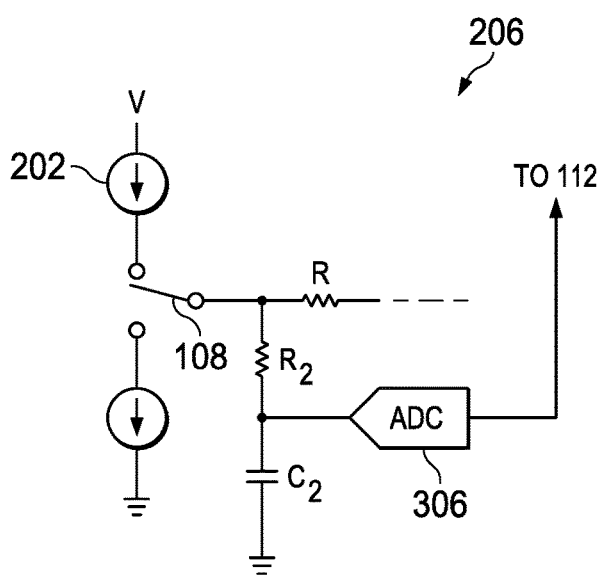
FIG. 3B is a block diagram schematic of an example embodiment of an alternative noise detection circuit in the system of FIG. 2A.

FIG. 3B illustrates additional detail for an alternative example embodiment of the noise measurement circuit 206 in FIG. 2A. Only part of FIG. 2A is duplicated in FIG. 3B to facilitate illustration and discussion. In the example of FIG. 3B, when the switch 108 is switched to current source 202, a known capacitance $C_2$ charges through a known resistance $R_2$. An A/D 306 measures the voltage on capacitance $C_2$ after a known period of time and the output of the A/D 306 is read by the timer/controller 112. Assuming that resistance R (trace resistance) is small relative to resistance $R_2$, the circuit of FIG. 3A effectively measures noise on node $N_1$. With calibration, the expected voltage on capacitance $C_2$ after the known period of time is known. If the actual voltage is significantly different than the expected voltage, the difference is assumed to be caused by noise.

For either example of noise measurement circuit 206, the noise measurement may be used change at least one capacitance measurement parameter. For example, the system 200 may determine that the noise is too great to initiate a capacitance measurement and the capacitance measurement may be deferred. Alternatively, the noise measurement may be used to determine whether a capacitance measurement is valid so capacitance measurements may be rejected if capacitance measurements are subject to excess noise. Alternatively, the reference voltages ($VREF_{HI}$, $VREF_{LO}$) may be adjusted based on noise level. For example, $VREF_{HI}$ may be adjusted closer to the supply voltage and $VREF_{LO}$ may be adjusted closer to ground if the noise level is relatively low. Alternatively, the timer/controller 112 may have an expected range of charging time periods (for example, FIG. 2C, $t_0$ to $t_1$ and $t_2$-$t_3$) and the timer/controller 112 may reject measurements having a charging time period outside the expected range. The expected range may be reduced if the noise measurement circuit 206 indicates that noise is relatively low.

FIG. 4A illustrates an example embodiment of a system 400 that is an alternative embodiment of the system 200 of FIG. 2A, illustrating an alternative way of ensuring that the time period for capacitance measurements is variable even when the capacitance (parallel C and $C_t$) is constant. In FIG. 4A, elements having the same reference numbers as in FIGS. 1A and 2A are all as described in conjunction with FIGS. 1A and 2A. In the example of FIG. 4A, there are at least two current sources (402, 404) that may be coupled to node $N_1$ by switches (406, 408) controlled by the timer/controller 112. In the example of FIG. 4A, node $N_1$ is discharged by a switch 410 instead of by a current source to ground, but a current source to ground may optionally be used. The currents sourced by current sources 402 and 404 are not equal. Accordingly, the time periods required for node $N_1$ to charge to the high reference voltage $VREF_{HI}$ are not equal because the currents provided by the different current sources are not equal. The timer/controller may select switches 406 and 408 in a pseudo-random sequence so that the voltage waveform on node $N_1$ is a-periodic even when the capacitance (parallel C and $C_t$) is constant. Alternatively, the system 400 may be configured so that a plurality of current sources are used to discharge, and the time periods required for node $N_1$ to discharge to the low reference voltage $VREF_{LO}$ are made to be unequal.

FIG. 4B illustrates an example waveform on node $N_1$ of FIG. 4A. At time $t_0$, switch 406 switches current source 402 to node $N_1$ and the capacitances (C and $C_t$) linearly charge until the voltage at node $N_1$ equals the high reference voltage $VREF_{HI}$. At time $t_1$, switch 410 is closed to discharge the capacitances. At time $t_2$, switch 410 opens and switch 408 closes to switch current source 404 to node $N_1$ and the capacitances (C and $C_t$) linearly charge until the voltage at node $N_1$ equals the high reference voltage $VREF_{HI}$. Note that since current source 402 is not identical to current source 404, the time period from $t_0$ to $t_1$ is different than the time period from $t_2$ to $t_3$. Switches 406 and 408 are closed in a pseudo-random sequence so that the resulting voltage waveform on node $N_1$ is a-periodic.

Figure 5:
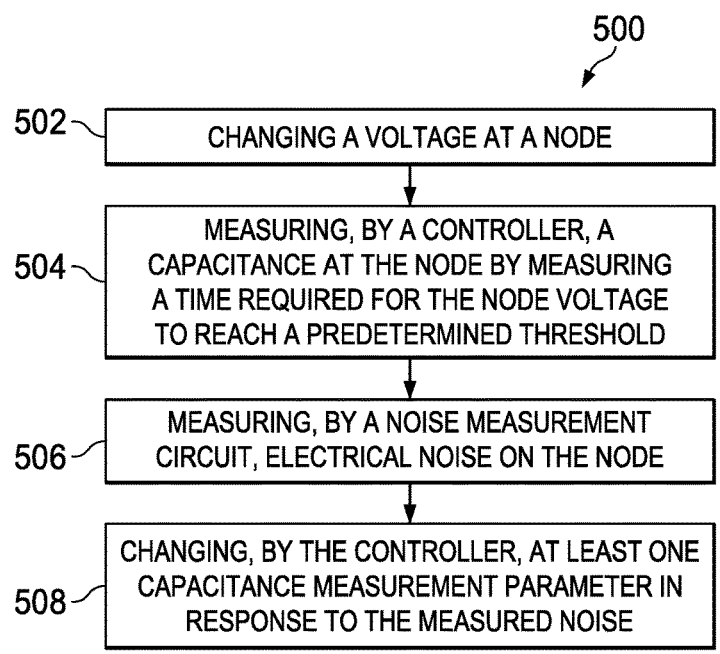
FIG. 5 is a flow chart illustrating an example embodiment of a method for capacitive sensing.

FIG. 5 illustrates an example method 500 for capacitive sensing. Note, the particular order of steps as illustrated does not mean that the steps must be performed in the illustrated order, and some steps may be performed simultaneously. At step 502 a voltage at a node is changed. At step 504 a controller measures a capacitance at the node by measuring a time required for the node voltage to equal a predetermined threshold. At step 506 a noise measurement circuit measures electrical noise on the node. At step 508 the controller changes at least one capacitance measurement parameter in response to the measured noise.

Note that illustrating the timer/controller 112 as one functional unit is only to facilitate illustration and discussion, and the timing and controlling functions may be implemented by separate functional units. Likewise, illustration of the comparator 110, the timer/controller 112, the noise measurement circuit 206, the ND 304, and the ND 306 as separate functional units is only to facilitate illustration and discussion, and the timer/controller 112 may include any or all of the separately labeled functions.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A circuit comprising:
   a variable capacitance device that includes a plate;
   a node coupled to the plate of the variable capacitance device;
   a first current source;
   a first charging switch coupled between the first current source and the node;
   a second current source;
   a second charging switch coupled between the second current source and the node, such that the first current source and the first charging switch are coupled in parallel with the second source and the second charging switch;
   a discharge switch coupled between the node and a ground node;
   a first comparator coupled to the node;
   a noise measurement circuit comprising:
      a rectifier having an input coupled to the node, and an output; and
      an integrator having an input coupled to the output of the rectifier and having an output coupled to provide a noise measurement; and
   a controller coupled to the first comparator and coupled to control the first charging switch, the second charging switch, and the discharge switch, the controller configured to:
      receive the noise measurement of the node;
      determine a range for a capacitance measurement of the variable capacitance device based on the noise measurement;
      determine whether the capacitance measurement of the variable capacitance device is within the range; and determine whether to reject the capacitance measurement based on whether the capacitance measurement is outside the range.

2. The circuit of claim 1, wherein the first charging switch, the second charging switch, and the discharge switch are coupled to the node by a resistor.

3. The circuit of claim 1, further comprising a capacitor coupled between the node and the ground node.

4. The circuit of claim 1, wherein the rectifier includes:
a second comparator that includes:
a set of differential inputs that includes a first input coupled to the input of the rectifier and a second input coupled to the output of the rectifier; and
an output;
a diode coupled between the output of the second comparator and the second input of the second comparator; and
a resistor coupled between the second input of the second comparator and ground.

5. The circuit of claim 1, wherein the integrator includes:
a second comparator that includes:
a set of differential inputs that includes a first input and a second input, wherein the second input is coupled to ground; and
an output;
a resistor coupled between the input of the integrator and the first input of the second comparator; and
a capacitor coupled between the output of the second comparator and the first input of the second comparator.

6. The circuit of claim 1, further comprising a capacitor coupled between the noise measurement circuit and the node.

7. A circuit comprising:
a variable capacitance device that includes a plate;
a node coupled to the plate of the variable capacitance device;
a charging circuit coupled to the node;
a discharge switch coupled between the node and a ground node;
a noise measurement circuit comprising:
a rectifier having an input coupled to the node, and an output; and
an integrator having an input coupled to the output of the rectifier and having an output coupled to a controller; and
the controller coupled to the charging circuit and the discharge switch, the controller configured to:
measure a capacitance of the variable capacitance device by:
causing the charging circuit to charge the variable capacitance device using a first current;
thereafter, causing the discharge switch to discharge the variable capacitance device;
causing the charging circuit to charge the variable capacitance device using a second current that is different from the first current; and
thereafter, causing the discharge switch to discharge the variable capacitance device;
receive a noise measurement of the node provided by the noise measurement circuit;
determine a range for the measurement of the capacitance of the variable capacitance device based on the noise measurement; and
determine whether to reject the measurement of the variable capacitance device based on whether the measurement of the capacitance is outside the range.

8. The circuit of claim 7, wherein the charging circuit includes:
a first current source to provide the first current;
a first charging switch coupled between the first current source and the node;
a second current source to provide the second current; and
a second charging switch coupled between the second current source and the node.

9. The circuit of claim 7, wherein the controller is configured to determine a parameter used to measure the capacitance of the variable capacitance device based on the noise measurement.

10. The circuit of claim 9, further comprising a comparator directly coupled to the node and having an output coupled to the controller, wherein:
the comparator is coupled to receive a first reference voltage and a second reference voltage; and
the parameter includes a magnitude of the first reference voltage and a magnitude of the second reference voltage.

11. The circuit of claim 9, wherein the controller is configured to defer the measurement of the capacitance of the variable capacitance device based on the output of the noise measurement circuit.

12. The circuit of claim 7, wherein the controller is configured to:
cause the discharge switch to discharge the variable capacitance device for a first period of time following the charging of the variable capacitance device using the first current; and
cause the discharge switch to discharge the variable capacitance device for a second period of time that is different from the first period of time following the charging of the variable capacitance device using the second current.

13. The circuit of claim 12, wherein the controller configured is to determine the first period of time and the second period of time pseudo-randomly.

14. The circuit of claim 7, further comprising a capacitor coupled between the node and the ground node.

15. A method comprising:
determining a capacitance measurement of a variable capacitance device, the variable capacitance device coupled to a node, the node coupled between a first switch circuit and a second switch circuit, the second switch circuit coupled to ground, wherein the determining includes:
charging the variable capacitance device using a first current from a first current source;
in response to the charging using the first current, discharging the variable capacitance device;
charging the variable capacitance device using a second current from a second current source, wherein the first current and the second current are different in magnitude; and
in response to the charging using the second current, discharging the variable capacitance device;
receiving a noise measurement of a node coupled to the variable capacitance device, the noise measurement of the node received from a noise measurement circuit coupled to the node, the noise measurement circuit comprising a rectifier having an input coupled to the node and an integrator having an input coupled to an output of the rectifier and having an output coupled to provide the noise measurement;

determine a range for the capacitance measurement of the variable capacitance device based on the noise measurement;

determining whether the capacitance measurement is outside the range; and rejecting the capacitance measurement in response to determining the capacitance measurement is outside the range.

16. The method of claim 15, wherein the charging of the variable capacitance device using the first current is performed for a first period and the charging of the variable capacitance device using the second current is performed for a second period that is different from the first period.

17. The method of claim 15, further comprising deferring the determining of the capacitance measurement of the variable capacitance device based on the noise measurement.

18. The method of claim 15, wherein the discharging of the variable capacitance device in response to the charging using the first current is performed for a first period and the discharging of the variable capacitance device in response to the charging using the second current is performed for a second period that is different from the first period.

19. The method of claim 18, further comprising pseudo-randomly determining the first period and the second period.

20. The method of claim 15, wherein the charging of the variable capacitance device using the first current and the charging of the variable capacitance device using the second current includes comparing a voltage at a node to a reference voltage.

21. The method of claim 20, further comprising determining the reference voltage based on the noise measurement.

* * * * *